(12) United States Patent
Tanabiki

(10) Patent No.: US 12,494,452 B2
(45) Date of Patent: Dec. 9, 2025

(54) STRAP WITH A NOTCH PORTION ATTACHED TO A CHIP BY A JOINT MEMBER

(71) Applicants: Kabushiki Kaisha Toshiba, Tokyo (JP); Toshiba Electronic Devices & Storage Corporation, Tokyo (JP)

(72) Inventor: Kyo Tanabiki, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 341 days.

(21) Appl. No.: 18/116,711

(22) Filed: Mar. 2, 2023

(65) Prior Publication Data
US 2024/0096843 A1 Mar. 21, 2024

(30) Foreign Application Priority Data
Sep. 21, 2022 (JP) .................. 2022-150404

(51) Int. Cl.
*H01L 23/31* (2006.01)
*H01L 23/00* (2006.01)
*H01L 23/495* (2006.01)

(52) U.S. Cl.
CPC .......... *H01L 24/37* (2013.01); *H01L 23/3107* (2013.01); *H01L 23/49524* (2013.01);
(Continued)

(58) Field of Classification Search
CPC ... H01L 24/37; H01L 24/40; H01L 23/49562; H01L 23/3107; H01L 23/49524;
(Continued)

(56) References Cited

U.S. PATENT DOCUMENTS

| 4,935,803 A | * | 6/1990 | Kalfus | H01L 23/49562 257/E23.044 |
| 7,972,906 B2 | * | 7/2011 | Cruz | H01L 23/49562 438/117 |

(Continued)

FOREIGN PATENT DOCUMENTS

| JP | H07-030042 A | 1/1995 |
| JP | H11-233703 A | 8/1999 |

(Continued)

OTHER PUBLICATIONS

Japanese Office Action dated Jul. 29, 2025 in Japanese Patent Application 2022-150404 with English Translation, 8 pages.

*Primary Examiner* — Alonzo Chambliss
(74) *Attorney, Agent, or Firm* — Kim & Stewart LLP

(57) ABSTRACT

According to one embodiment, a semiconductor device includes: a chip; a first electrode provided on the chip; a first connector provided above the first electrode, extending in a first direction, and provided with a joint portion to be joined to the first electrode, on an end portion in the first direction of the first connector; and a joint member for use in joint between the first electrode and the joint portion. The joint portion is provided with a notch portion on at least one end portion in the first direction of an upper surface of the joint portion. The joint member is in contact with the first electrode, a lower surface of the joint portion facing the first electrode, and at least part of the notch portion.

20 Claims, 18 Drawing Sheets

(52) U.S. Cl.
CPC .. *H01L 23/49551* (2013.01); *H01L 23/49562* (2013.01); *H01L 24/40* (2013.01); *H01L 2224/37013* (2013.01); *H01L 2224/40177* (2013.01); *H01L 2224/40491* (2013.01); *H01L 2924/181* (2013.01)

(58) Field of Classification Search
CPC ......... H01L 23/49551; H01L 2924/181; H01L 2224/37013; H01L 2224/40177; H01L 2224/40491; H01L 2224/37
See application file for complete search history.

(56) References Cited

U.S. PATENT DOCUMENTS

| | | | |
|---|---|---|---|
| 11,177,197 B2 * | 11/2021 | Noquil | ............... H01L 24/14 |
| 2013/0307130 A1 * | 11/2013 | Oga | ............... H01L 24/40 |
| | | | 257/666 |
| 2021/0280500 A1 | 9/2021 | Inoue | |
| 2023/0352380 A1 | 11/2023 | Hayashida | |

FOREIGN PATENT DOCUMENTS

| | | | |
|---|---|---|---|
| JP | 2012049395 A * | 3/2012 | |
| JP | 5252934 A | 7/2013 | |
| JP | 2015-069990 A | 4/2015 | |
| JP | 2021-141235 A | 9/2021 | |
| WO | 2022185545 A1 | 9/2022 | |

* cited by examiner

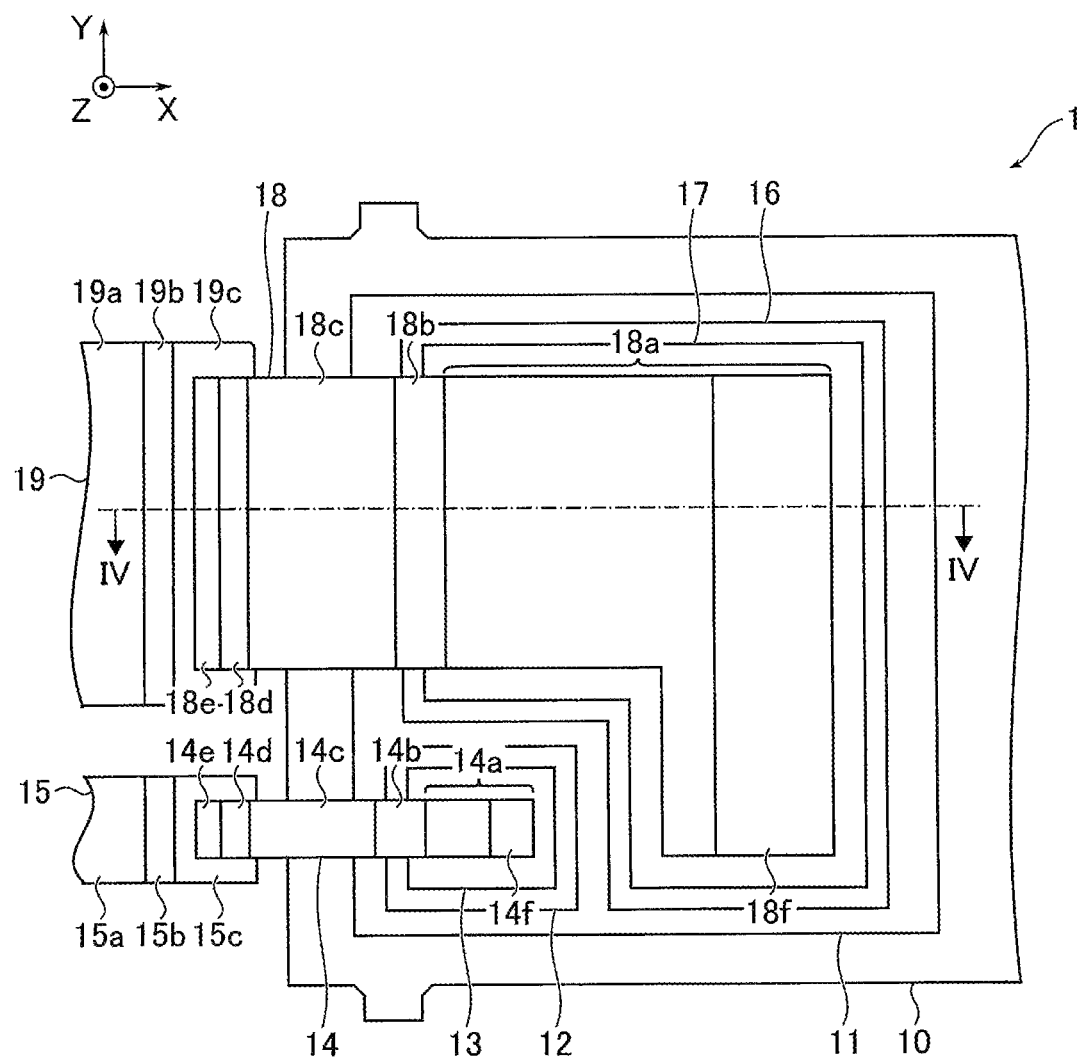
F I G. 14

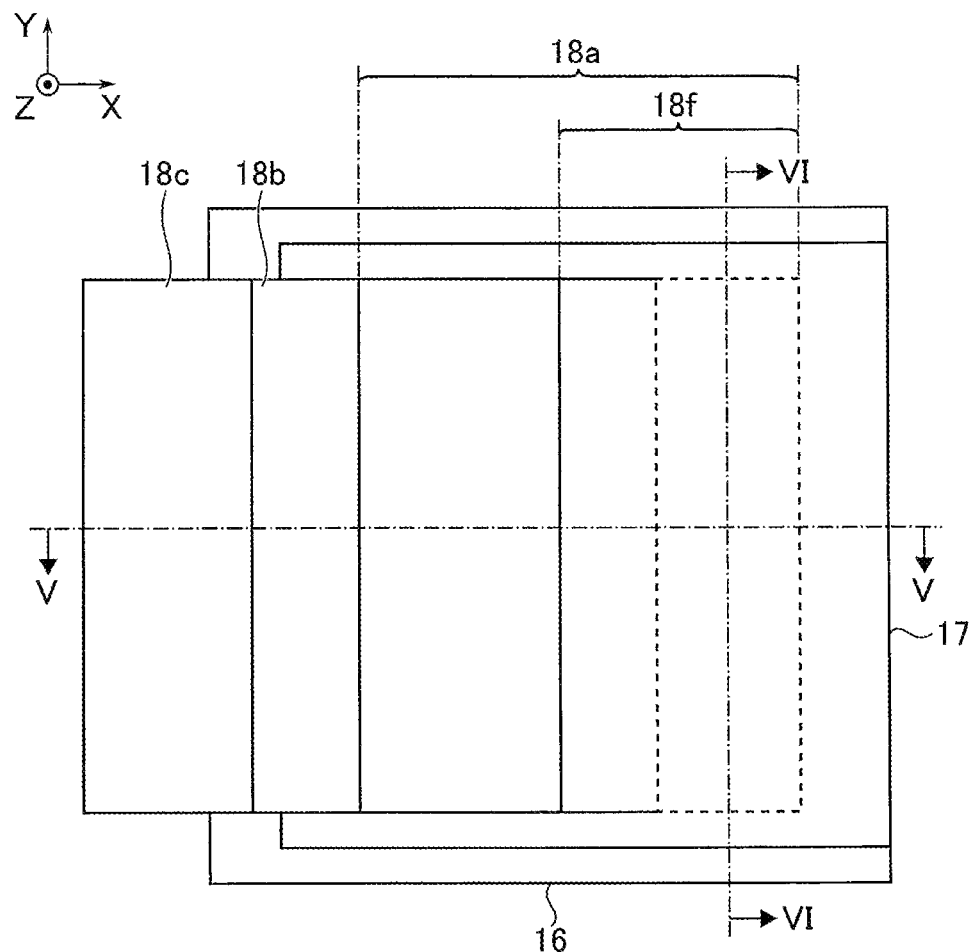
F I G. 16

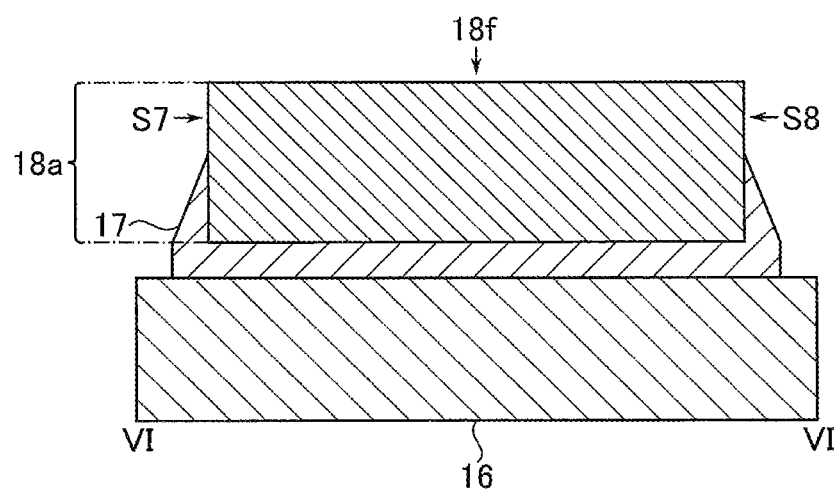
F I G. 18

STRAP WITH A NOTCH PORTION ATTACHED TO A CHIP BY A JOINT MEMBER

CROSS-REFERENCE TO RELATED APPLICATIONS

This application is based upon and claims the benefit of priority from Japanese Patent Application No. 2022-150404, filed Sep. 21, 2022, the entire contents of which are incorporated herein by reference.

FIELD

Embodiments described herein relate generally to a semiconductor device.

BACKGROUND

A semiconductor device using a lead frame is known.

BRIEF DESCRIPTION OF THE DRAWINGS

FIG. 14 is a plan view showing an example of a configuration of a semiconductor device according to a fourth embodiment.

FIG. 16 is a plan view showing a configuration of part of a source terminal included in the semiconductor device according to the fourth embodiment.

FIG. 18 is a cross-sectional view showing a cross-sectional structure of part of the source terminal included in the semiconductor device according to the fourth embodiment.

DETAILED DESCRIPTION

Figure 1:
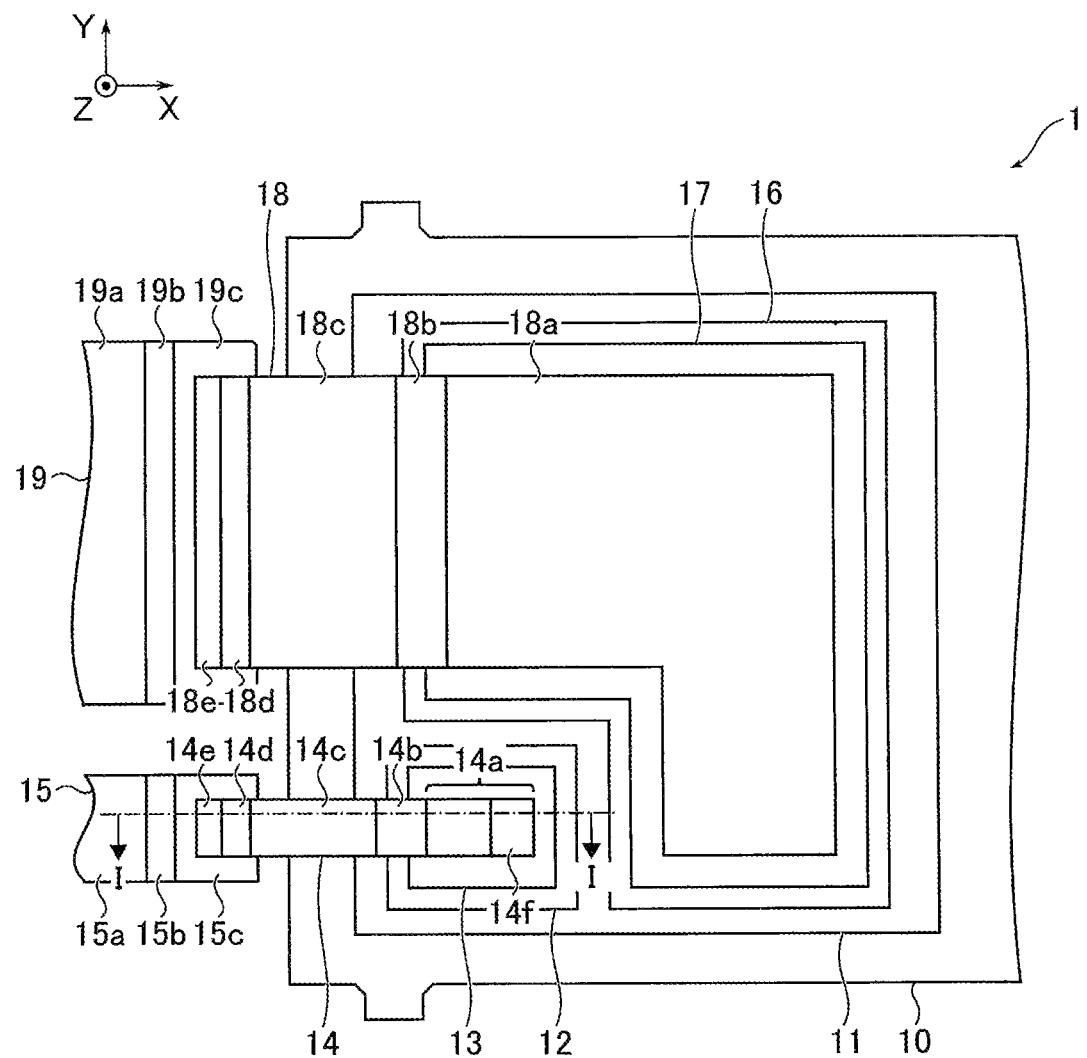
FIG. 1 is a plan view showing an example of a configuration of a semiconductor device according to a first embodiment.

In general, according to one embodiment, a semiconductor device includes: a chip; a first electrode provided on the chip; a first connector provided above the first electrode, extending in a first direction, and provided with a joint portion to be joined to the first electrode, on an end portion in the first direction of the first connector; and a joint member for use in joint between the first electrode and the joint portion. The joint portion is provided with a notch portion on at least one end portion in the first direction of an upper surface of the joint portion. The joint member is in contact with the first electrode, a lower surface of the joint portion facing the first electrode, and at least part of the notch portion.

Hereinafter, embodiments will be described with reference to the accompanying drawings. The dimensions and ratios in the drawings are not always the same as the actual ones. In the following description, constituent elements having substantially the same function and configuration will be assigned the same reference numeral or symbol and repetitive descriptions may be omitted. In the case where elements having similar configurations are distinguished from each other in particular, their identical reference symbols may be assigned different letters or numbers. All of the descriptions of an embodiment are applicable as descriptions of another embodiment, unless explicitly or self-evidently excluded.

1. First Embodiment

A semiconductor device according to a first embodiment will be described. Hereinafter, a semiconductor device using a lead frame will be described as an example. The semiconductor device is used for, e.g., a transistor package.

1.1 Configuration of Semiconductor Device

A configuration of the semiconductor device will be described with reference to FIG. 1. FIG. 1 is a plan view showing an example of the configuration of the semiconductor device.

As shown in FIG. 1, a semiconductor device 1 includes a lead frame 10, a chip 11, a gate electrode (pad) 12, a joint member 13, a gate terminal (connector) 14, an electrode terminal 15, a source electrode (pad) 16, a joint member 17, a source terminal (connector) 18, an electrode terminal 19, and a resin 30. The example shown in FIG. 1 omits the resin 30. In the following description, an X direction is substantially parallel to a surface of the lead frame 10 and corresponds to, for example, a direction from the electrode terminal 15 to the lead frame 10. A Y direction is substantially parallel to the surface of the lead frame 10 and corresponds to, for example, a direction from the electrode terminal 15 to the electrode terminal 19. A 2 direction is substantially perpendicular to the surface of the lead frame 10 and corresponds to a direction from the lead frame 10 to the chip 11.

The lead frame 10 is a frame configured to support and fix the chip 11. The lead frame 10 is formed into, for example, a plate shape. Of the two ends in the X direction of the lead frame 10, the one end that is far from the electrode terminal 15 extends in the X direction. The lead frame 10 is formed of a conductive material and may be, for example, a metal material.

The chip 11 is, for example, an integrated circuit (IC) chip. The chip 11 is provided on the lead frame 10.

The gate electrode 12 is provided on the chip 11. The gate electrode 12 is formed into, for example, a substantially rectangular shape when viewed from the top (from the upper side of the drawing sheet). The gate electrode 12 is formed of a conductive material and may be, for example, a metal material.

The joint member 13 is, for example, a conductive material such as solder. The joint member 13 is formed into, for example, a substantially rectangular shape when viewed from the top. The joint member 13 is provided on the gate electrode 12. The joint member 13 joins the gate electrode 12 to the gate terminal 14.

The gate terminal 14 is, for example, a terminal which electrically couples the gate electrode 12 to the electrode terminal 15. The gate terminal 14 is formed into, for example, a substantially rectangular shape when viewed from the top. The gate terminal 14 extends in the X direction. The gate terminal 14 is provided above the gate electrode 12. The gate terminal 14 is formed of a conductive material and may be, for example, a metal material.

The gate terminal 14 includes a joint portion 14a, a bending portion 14b, a bridge portion 14c, a bending portion 14d, and a joint portion 14e.

The gate terminal 14 has the joint portion 14a on the one of the two end portions in the X direction which is closer to the gate electrode 12 (the end portion on the gate electrode 12 side), and the joint portion 14e on the other end portion, which is closer to the electrode terminal 15 (the end portion on the electrode terminal 15 side).

The joint portion 14a is joined onto the gate electrode 12 by means of the joint member 13. By this, the gate terminal 14 is electrically coupled to the gate electrode 12.

The upper surface of the joint portion 14a is provided with a notch portion 14f. That is, the notch portion 14f corresponds to part of the upper surface of the joint portion 14a. The notch portion 14f is provided on at least one of the two end portions in the X direction of the upper surface of the joint portion 14a (the end portion far from the bending portion 14b). In other words, the joint portion 14a is provided with the notch portion 14f on at least one of the two end portions in the X direction of the upper surface of the joint portion 14a. Configurations of the joint portion 14a and the notch portion 14f will be described later in detail.

The gate terminal 14 is bent, for example, upward on the boundary between the joint portion 14a and the bending portion 14b, and is bent in the X direction on the boundary between the bending portion 14b and the bridge portion 14c. The gate terminal 14 is bent, for example, downward on the boundary between the bridge portion 14c and the bending portion 14d, and is bent in the X direction on the boundary between the bending portion 14d and the joint portion 14e. The upper surface of the joint portion 14a, the upper surface of the bridge portion 14c, and the upper surface of the joint portion 14e are substantially parallel to each other. The upper surface of the bridge portion 14c is positioned above the upper surface of the joint portion 14a and the upper surface of the joint portion 14e. In other words, the gate terminal 14 has a step in the X direction.

The electrode terminal 15 is, for example, a gate terminal for use in coupling to an outside of the semiconductor device 1. The electrode terminal 15 is spaced apart from the lead frame 10 in the X direction. Of the two ends in the X direction of the electrode terminal 15, the one end that is far from the lead frame 10 extends in the X direction. The electrode terminal 15 is formed of a conductive material and may be, for example, a metal material.

The electrode terminal 15 includes a base portion 15a, a bending portion 15b, and a joint portion 15c. The electrode terminal 15 is bent, for example, upward on the boundary between the base portion 15a and the bending portion 15b, and is bent in the X direction on the boundary between the bending portion 15b and the joint portion 15c. The upper surface of the base portion 15a and the upper surface of the joint portion 15c are substantially parallel to each other. The upper surface of the joint portion 15c is positioned above the upper surface of the base portion 15a. In other words, the electrode terminal 15 has a step in the X direction.

The joint portion 14e is joined onto the joint portion 15c of the electrode terminal 15 by means of a joint member (not shown). By this, the gate terminal 14 is electrically coupled to the electrode terminal 15.

The source electrode 16 is provided on the chip 11. The source electrode 16 is formed into, for example, a substantially letter L shape when viewed from the top. The source electrode 16 is formed of a conductive material and may be, for example, a metal material.

The joint member 17 is, for example, a conductive material such as solder. The joint member 17 is formed into, for example, a substantially letter L shape when viewed from the top. The joint member 17 is provided on the source electrode 16. The joint member 17 joins the source electrode 16 to the source terminal 18.

The source terminal 18 is, for example, a terminal which electrically couples the source electrode 16 to the electrode terminal 19. The source terminal 18 is formed into, for example, a substantially letter L shape when viewed from the top. The source terminal 18 extends in the X direction. The source terminal 18 is provided above the source electrode 16. The source terminal 18 is formed of a conductive material and may be, for example, a metal material.

The source terminal 18 includes a joint portion 18a, a bending portion 18b, a bridge portion 18c, a bending portion 18d, and a joint portion 18e.

The source terminal 18 has the joint portion 18a on the one of the two end portions in the X direction which is closer to the source electrode 16 (the end portion on the source electrode 16 side), and the joint portion 18e on the other end portion, which is closer to the electrode terminal 19 (the end portion on the electrode terminal 19 side).

The joint portion 18a is joined onto the source electrode 16 by means of the joint member 17. By this, the source terminal 18 is electrically coupled to the source electrode 16.

The source terminal 18 is bent, for example, upward on the boundary between the joint portion 18a and the bending portion 18b, and is bent in the X direction on the boundary between the bending portion 18b and the bridge portion 18c. The source terminal 18 is bent, for example, downward on the boundary between the bridge portion 18c and the bending portion 18d, and is bent in the X direction on the boundary between the bending portion 18d and the joint portion 18e. The upper surface of the joint portion 18a, the upper surface of the bridge portion 18c, and the upper surface of the joint portion 18e are substantially parallel to each other. The upper surface of the bridge Portion 18c is positioned above the upper surface of the joint portion 18a and the upper surface of the joint portion 18e. In other words, the source terminal 18 has a step in the X direction.

The electrode terminal 19 is, for example, a source terminal for use in coupling to an outside of the semiconductor device 1. The electrode terminal 19 is spaced apart from the electrode terminal 15 in the Y direction. The electrode terminal 19 is spaced apart from the lead frame 10 in the X direction. Of the two ends in the X direction of the electrode terminal 19, the one end far from the lead frame 10 extends in the X direction. The electrode terminal 19 is formed of a conductive material and may be, for example, a metal material.

The electrode terminal 19 includes a base portion 19a, a bending portion 19b, and a joint portion 19c. The electrode terminal 19 is bent, for example, upward on the boundary between the base portion 19a and the bending portion 19b, and is bent in the X direction on the boundary between the bending portion 19b and the joint portion 19c. The upper surface of the base portion 19a and the upper surface of the joint portion 19c are substantially parallel to each other. The upper surface of the joint portion 19c is positioned above the upper surface of the base portion 19a. In other words, the electrode terminal 19 has a step in the X direction.

The joint portion 18e is joined onto the joint portion 19c of the electrode terminal 19 by means of a joint member (not shown). By this, the source terminal 18 is electrically coupled to the electrode terminal 19.

Part of the lead frame 10, all of the chip 11, all of the gate electrode 12, all of the joint member 13, all of the gate terminal 14, part of the electrode terminal 15, all of the source electrode 16, all of the joint member 17, all of the source terminal 18, and part of the electrode terminal 19 are covered with the resin 30 (not shown). The resin 30 is, for example, epoxy resin.

The lead frame 10 and the electrode terminal 15 and 19 shown in FIG. 1 correspond to part of a lead frame (not shown), and also correspond to the remainder of the lead frame (not shown) cut and removed through a manufacturing process. The lead frame 10 functions as, for example, a drain electrode.

A cross-sectional structure of the semiconductor device 1 will be described with reference to FIG. 2.

Figure 2:
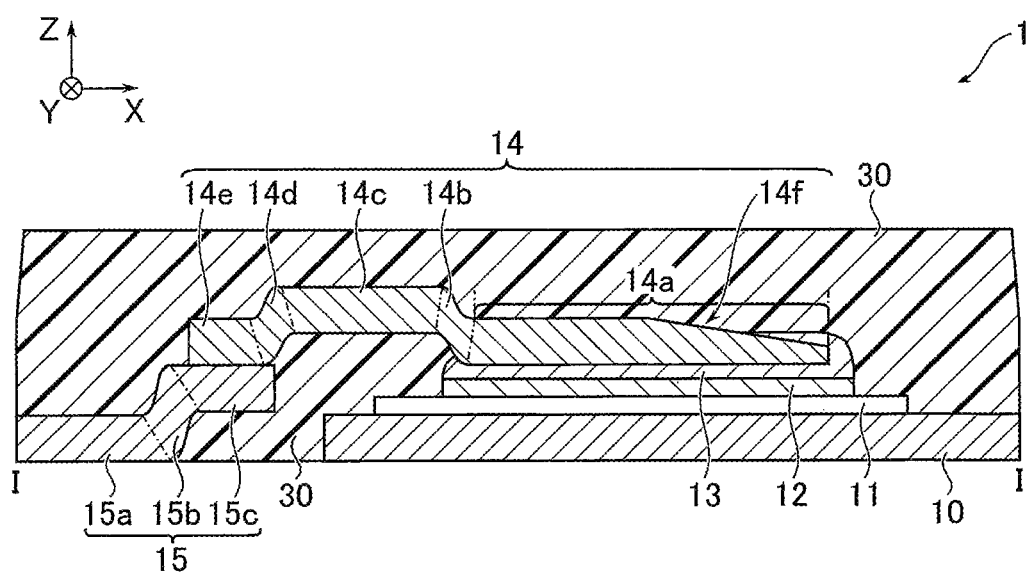
FIG. 2 is a cross-sectional view showing an example of a cross-sectional structure of the semiconductor device according to the first embodiment.

FIG. 2 is a cross-sectional view showing an example of a cross-sectional structure of the semiconductor device 1 (a cross-sectional view taken along line I-I of FIG. 1).

As shown in FIG. 2, the electrode terminal 15 is bent at the bending portion 15b in such a manner that the upper surface of the joint portion 15c is positioned above the upper surface of the base portion 15a.

The chip 11 is provided on the lead frame 10. The gate electrode 12 is provided on the chip 11. The joint members 13 is provided on the gate electrode 12. The joint portion 14a of the gate terminal 14 is provided on the joint member 13. The lower surface of the joint portion 14a, the side surface of the end portion in the X direction of the joint portion 14a, and part of the notch portion 14f are in contact with the joint member 13. The gate terminal 14 is bent at the bending portions 14b and 14d in such a manner that the upper surface of the bridge portion 14c is positioned above the upper surface of the joint portion 14a and the upper surface of the joint Portion 14e. The notch portion 14f extends in the X direction, downward from the remaining part of the upper surface of the joint portion 14a excluding the notch portion 14f.

The joint portion 14e of the gate terminal 14 is provided on the joint portion 15c of the electrode terminal 15. The joint portion 14e is joined to the joint portion 15c by means of a joint member (not shown).

The lead frame 10, the chip 11, the gate electrode 12, the joint member 13, the gate terminal 14, and the electrode terminal 15 are covered with the resin 30. A space surrounded by the lead frame 10, the chip 11, the gate electrode 12, the joint member 13, the gate terminal 14, and the electrode terminal 15 is filled with the resin 30.

1.2 Configuration of Gate Terminal

A configuration of the gate terminal 14 will be described in detail with reference to FIG. 3 to FIG. 5. The following will mainly provide a description of configurations of the joint portion 14a and the notch portion 14f.

Figure 3:
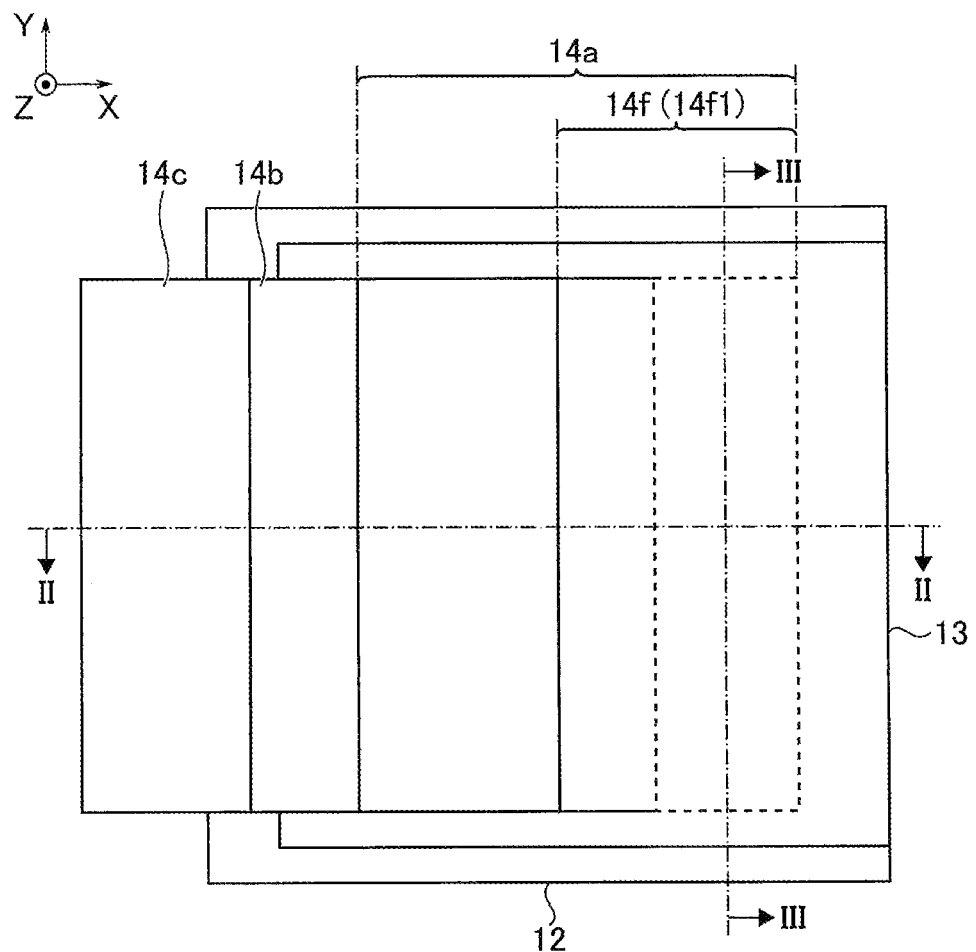
FIG. 3 is a plan view showing a configuration of part of a gate terminal included in the semiconductor device according to the first embodiment.

FIG. 3 is a plan view showing a configuration of part of the gate terminal 14 (the joint portion 14a, the bending portion 14b, and the bridge portion 14c).

As shown in FIG. 3, the joint portion 14a is provided on the joint member 13. Part of the notch portion 14f (hereinafter, also referred to as a "notch portion 14f1") is covered with the joint member 13. A portion surrounded by a broken line in FIG. 3 corresponds to the aforementioned part of the notch portion 14f1, which is covered with the joint member 13.

FIG. 3 shows the example in which the one of the two ends in the X direction of the joint member 13 which is closer to the notch portion 14f1 reaches one end in the direction of the gate electrode 127 however, the aforementioned one end of the joint member 13 may not reach the aforementioned one end in the X direction of the gate electrode 12.

Figure 4:
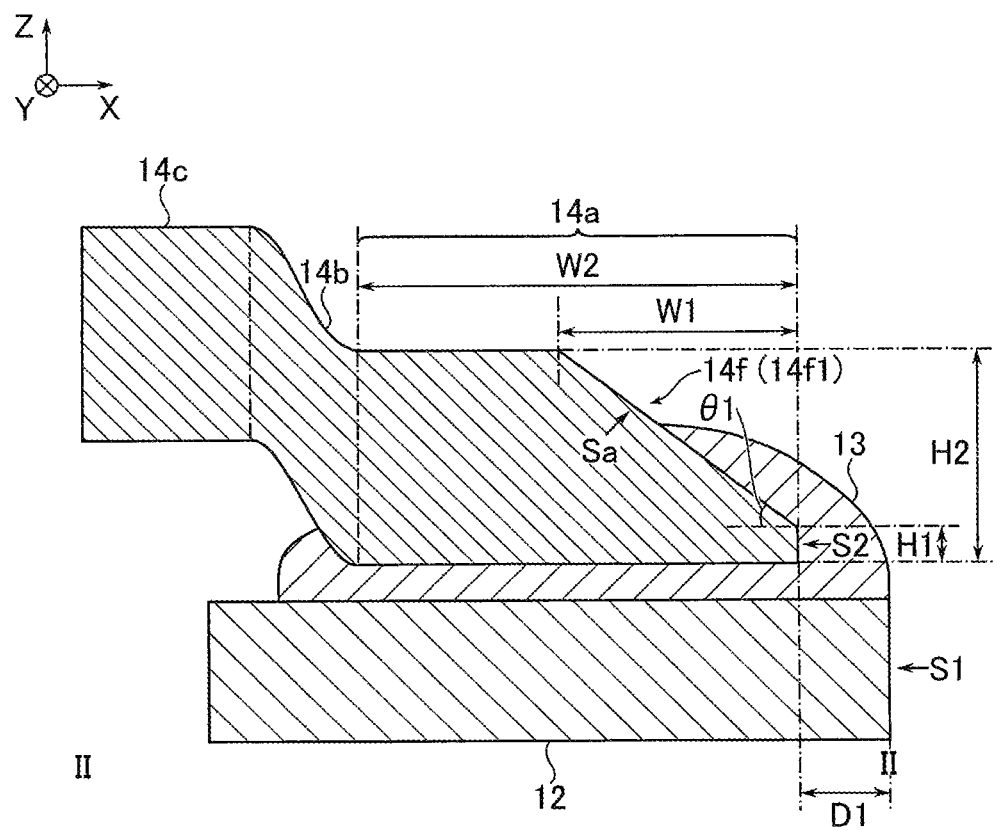
FIG. 4 is a cross-sectional view showing a cross-sectional structure of part of the gate terminal included in the semiconductor device according to the first embodiment.

FIG. 4 is a cross-sectional view showing a cross-sectional structure of part of the gate terminal 14 (a cross-sectional view taken along line II-II of FIG. 3). In the following description, the side surface of the end portion in the X direction of the gate electrode 12 (the side surface (the end surface) of the end portion far from the bending portion 14b) will be referred to as a "surface S1", and the side surface (the end surface) of the end Portion in the X direction of the joint portion 14a will be referred to as a "surface S2".

As shown in FIG. 4, the notch portion 14f1 has an inclined surface Sa with respect to the remaining part of the upper surface of the joint portion 14a excluding the notch portion 14f1. The inclined surface Sa is formed by, for example, pressing some kind of member on the corner of the joint portion 14a and crushing it. The method of forming the inclined surface Sa is not limited to this. An angle θ1 of the inclined surface Sa with respect to a surface in parallel to the remaining part of the upper surface of the joint portion 14a excluding the notch portion 14f1 may be set to a given value.

A height H1 of the surface S2 of the joint portion 14a (a height from the lower surface of the joint portion 14a to the lower end of the notch portion 14f1) is lower than a height H2 from the lower surface of the joint portion 14a to the remaining part of the upper surface of the joint portion 14a excluding the notch portion 14f1. In the X direction, a position of the surface S2 of the joint portion 14a does not reach a position of the surface S1 of the gate electrode 12. In other words, the side surface S2 of the end portion in the X direction of the joint portion 14a is positioned between the side surface S1 of one of the two end portions in the X direction of the gate electrode 12 and the side surface of the other end portion thereof. A width W1 of the notch portion 14f1 is smaller in the X direction than a width W2 of the joint portion 14a.

The joint member 13 is in contact with the gate electrode 12, the lower surface of the joint portion 14a facing the gate electrode 12, and at least part of the notch portion 14f1. The joint member 13 is in contact with the side surface S2 of the end portion in the X direction of the joint portion 14a. The joint member 13 is in contact with part of the lower surface of the bending portion 14b. In other words, the joint member 13 covers the surface S2 of the joint portion 14a, part of the notch portion 14f1, and part of the lower surface of the bending portion 14b. That is, the notch portion 14f1 has a portion not covered with (not in contact with) the joint member 13.

When the molten joint member 13 is provided on the gate electrode 12 and the joint portion 14a of the gate terminal 14 is provided on the joint member 13, the joint portion 14a is self-aligned by surface tension of the joint member 13, thereby being arranged at an appropriate position. Furthermore, at this time, the joint member 13 flows from the interval between the gate electrode 12 and the joint portion 14a, expands therefrom in all the directions, and then reaches the side surface of the joint portion 14a, the notch portion 14f1, and the lower surface of the bending portion 14b. In this manner, the surface S2 of the joint portion 14a, part of the notch portion 14f1, and part of the lower surface of the bending portion 14b are covered with the joint member 13 by surface tension of the joint member 13.

A distance D1 in the X direction from the surface S1 of the gate electrode 12 to the surface S2 of the joint portion 14a is, for example, about 50 μm. This distance may be set such that, for example, the surface tension of the molten joint member 13 enables the joint member 13 to cover part of the notch portion 14f1 without running downward from one end of the gate electrode 12.

A height H1 of the surface S2 of the joint portion 14a is, for example, about 20 μm to 30 μm where a height H2 from the lower surface of the joint portion 14a to the remaining part of the upper surface of the joint portion 14a excluding the notch portion 14f1 is about 150 μm. This height may be set such that, for example, the surface tension of the molten joint member 13 enables the joint member 13 to cover part of the notch portion 14f1.

The width W1 of the notch portion 14f1 is, for example, about 50 μm. This width may be set such that, for example, the surface tension of the molten joint member 13 enables the joint member 13 to cover part of the notch portion 14f1 without running downward from one end of the notch portion 14f1. The width may be set such that, for example, the surface tension of the joint member 13 covering the notch portion 14f1 enables the joint portion 14a to be arranged at an appropriate position without the joint portion 14a being pressed in the X direction toward the electrode terminal 15.

Figure 5:
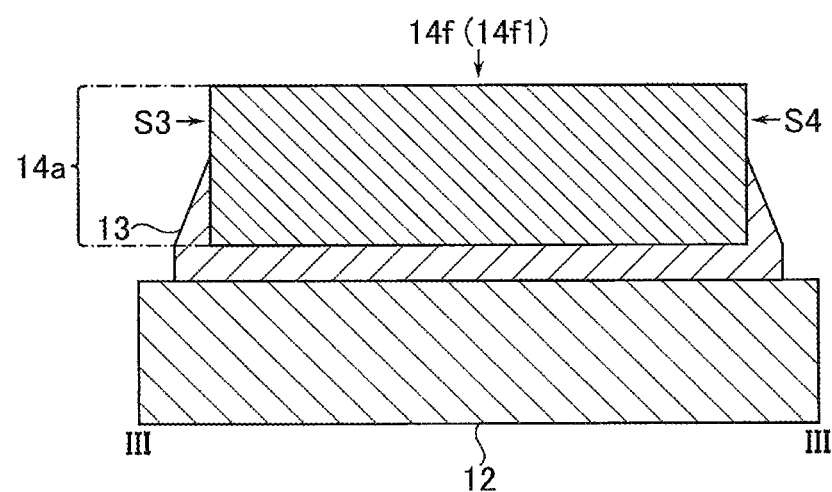
FIG. 5 is a cross-sectional view showing a cross-sectional structure of part of the gate terminal included in the semiconductor device according to the first embodiment.

FIG. 5 is a cross-sectional view showing a cross-sectional structure of part of the gate terminal 14 (a cross-sectional view taken along line of FIG. 3). The example shown in FIG. 5 omits the joint member 13 in contact with the upper surface of the notch portion 14f1. In the following description, the side surfaces (the end surfaces) of the two end portions in the Y direction of the joint portion 14a will be referred to as a "surface S3" and a "surface S4", respectively.

As shown in FIG. 5, the lower surface of the joint portion 14a is in contact with the joint member 13. Part of the surface S3 of the joint portion 14a and part of the surface S4 of the joint portion 14a are in contact with the joint member 13. In other words, the joint member 13 covers part of the surface S3 of the joint portion 14a and part of the surface S4 of the joint portion 14a.

The configuration according to the present embodiment can improve the yield of the semiconductor device.

In the case where the gate electrode 12 and the gate terminal 14 are joined together by providing the joint member 13 on the gate electrode 12 and providing the joint portion 14a of the gate terminal 14 on the joint member 13, only the lower surface of the joint portion 14a and part of the side surface of the joint portion 14a being covered with the joint member 13 may not bring sufficient joint between the gate electrode 12 and the gate terminal 14.

In the present embodiment, the upper surface of the joint portion 14a is provided with the notch portion 14f1. The notch portion 14f1 is provided on at least one of the two end portions in the X direction of the upper surface of the joint portion 14a (the end portion far from the bending portion 14b). The height H1 from the lower surface of the joint portion 14a to the lower end of the notch portion 14f1 is lower than the height H2 from the lower surface of the joint portion 14a to the remaining part of the upper surface of the joint portion 14a excluding the notch portion 14f1. In this manner, because of the surface tension of the joint member 13, not only the lower surface of the joint portion 14a, part of the surface S3 of the joint portion 14a, and part of the surface S4 of the joint portion 14a, but also the surface S2 of the joint portion 14a, part of the notch portion 14f1, and part of the lower surface of the bending portion 14b are covered with the joint member 13. This can enhance the strength of joint between the gate electrode 12 and the gate terminal 14 as compared with the case in which only the lower surface of the joint portion 14a and part of the side surface of the joint portion 14a are covered with the joint member 13.

Furthermore, in the present embodiment, a position of the surface S2 of the joint portion 14a does not reach a position of the surface S1 of the gate electrode 12 in the X direction. This can prevent a situation in which the joint member 13 runs downward from one end of the gate electrode 12, thereby failing to cover the notch portion 14f1.

Furthermore, in the present embodiment, the width W1 of the notch portion 14f1 is smaller than the width W2 of the joint portion 14a. This can prevent a situation in which the joint portion 14a is pressed in the X direction toward the electrode terminal 15 by the joint member 13 covering the notch portion 14f1 entirely or mostly, so that the joint portion 14a is not arranged at an appropriate position.

Accordingly, the configuration according to the present embodiment can improve the yield of the semiconductor device.

1.3 Modification

A semiconductor device according to a modification of the first embodiment will be described. The semiconductor device 1 according to the modification of the first embodiment differs from that of the first embodiment in that the inclined surface Sa of the notch portion 14f1 is provided with a groove. The following will omit a description of a configuration similar to that of the first embodiment and will mainly provide a description of a configuration different from that of the first embodiment.

1.3.1 Configuration of Gate Terminal

A configuration of the gate terminal 14 will be described in detail with reference to FIG. 6 and FIG. 7. The following will mainly provide a description of configurations of the joint portion 14a and the notch portion 14f.

Figure 6:
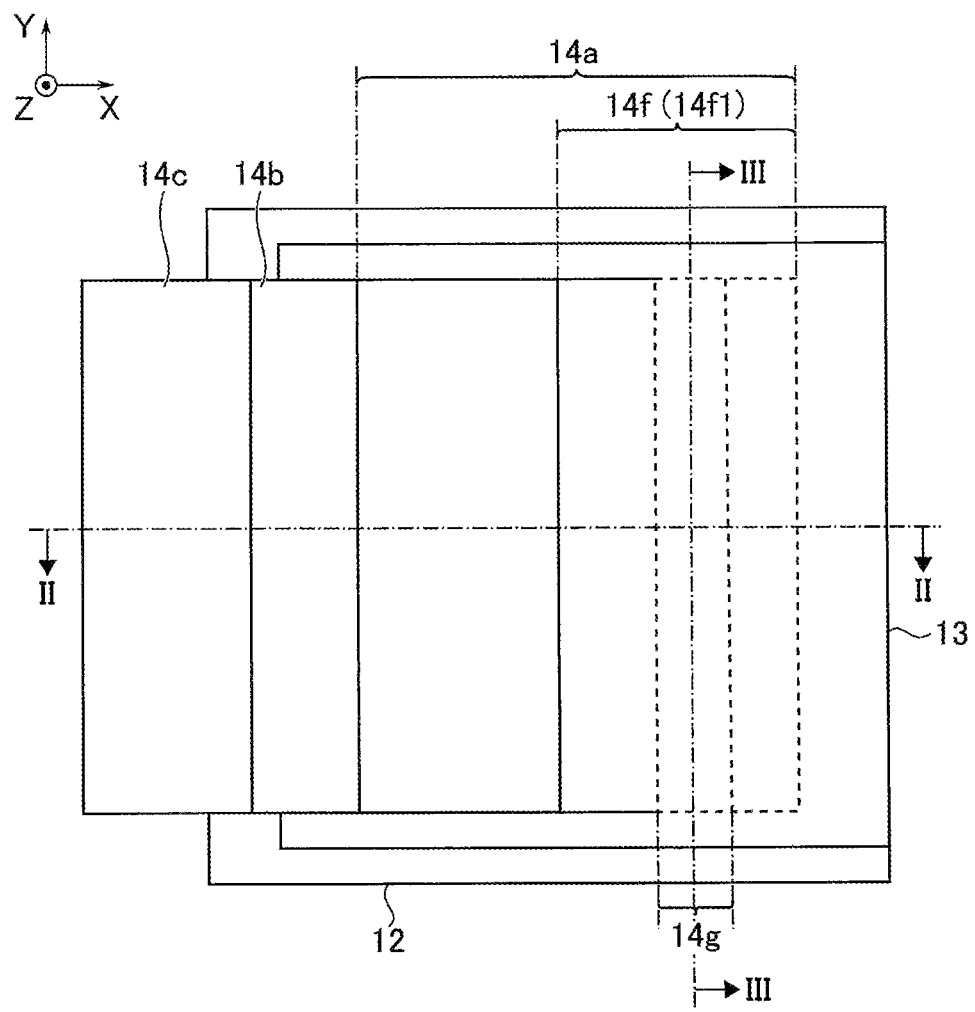
FIG. 6 is a plan view showing a configuration of part of a gate terminal included in a semiconductor device according to a modification of the first embodiment.

FIG. 6 is a plan view showing a configuration of part of the gate terminal 14 (the joint portion 14*a*, the bending portion 14*b*, and the bridge portion 14*c*).

As shown in FIG. 6, the notch portion 14*f*1 has a groove 14*g*. Part of the notch portion 14*f*1 (including the groove 14*g*) is covered with the joint member 13. A portion surrounded by a broken line in FIG. 6 corresponds to the aforementioned part of the notch portion 14*f*1, which is covered with the joint member 13.

Figure 7:
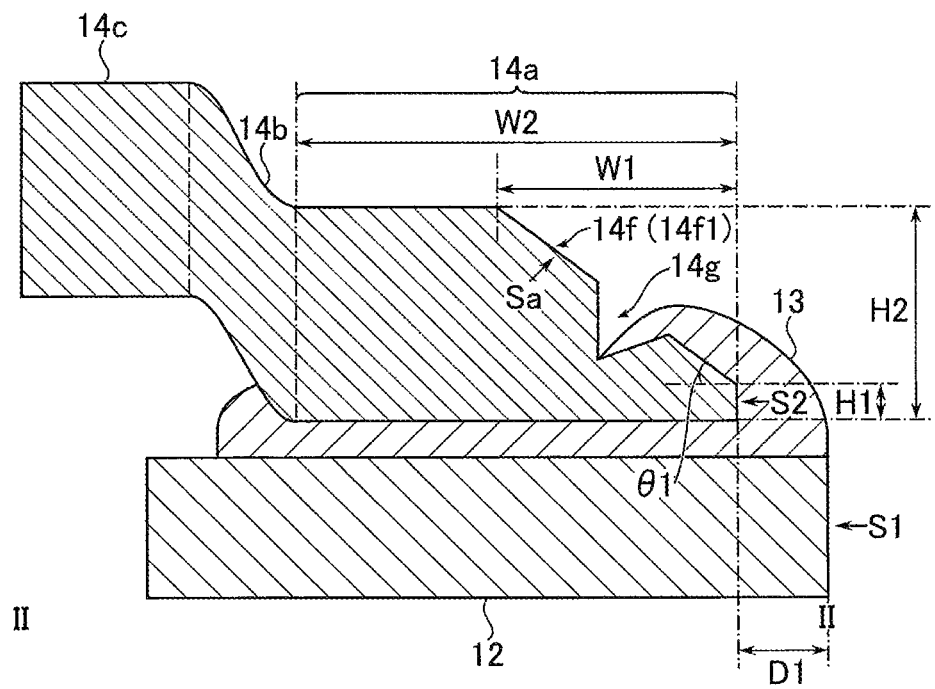
FIG. 7 is a cross-sectional view showing a cross-sectional structure of part of the gate terminal included in the semiconductor device according to the modification of the first embodiment.

FIG. 7 is a cross-sectional view showing a cross-sectional structure of part, of the gate terminal 14 (a cross-sectional view taken along line TI-II of FIG. 6).

As shown in FIG. 7, the notch portion 14*f*1 has the groove 14*g*. The groove 14*g* is provided on the inclined surface Sa of the notch portion 14*f*1. The groove 14*g* is formed by, for example, anisotropic etching. The method of forming the groove 14*g* is not limited to this.

A position of the lower end of the groove 14*g* does not reach a position of the lower surface of the joint portion 14*a*. A position of one end in the X direction of the groove 14*g* (one end closer to the surface S2 of the joint portion 14*a*) does not reach a position of the surface S2 of the joint portion 14*a*. In the X direction, the width of the groove 14*g* is smaller than the width W1 of the notch portion 14*f*1.

The joint member 13 is in contact with the gate electrode 12, the lower surface of the joint portion 14*a* facing the gate electrode 12, and at least part of the notch portion 14*f*1. The joint member 13 is in contact with the side surface S2 of the end portion in the X direction of the joint portion 14*a*. The joint member 13 is in contact with at least part of the groove 14*g*. The joint member 13 is in contact with part of the lower surface of the bending portion 14*b*. In other words, the joint member 13 covers the surface S2 of the joint portion 14*a*, part of the notch portion 14*f*1, part of the groove 14*g*, and part of the lower surface of the bending portion 14*b*. That is, the notch portion 14*f*1 has a portion not covered with (not in contact with) the joint member 13.

FIG. 7 shows the example in which the side surface of the groove 14*g* is not covered with the joint member 13; however, the side surface of, the groove 14*g* may be covered with the joint member 13.

A cross-sectional view taken along line of FIG. 6 is similar to that of FIG. 5 according to the first embodiment.

As with the first embodiment, the present modification can improve the yield of the semiconductor device.

In the present modification, the notch portion 14*f*1 has the groove 14*g*. For this reason, the joint member 13 that has reached from the lower surface of the joint portion 14*a* to the notch portion 14*f*1 and has flowed into the notch portion 14*f*1 is stopped at the groove 14*g*. This can prevent a situation in which the joint portion 14*a* is pressed in the X direction toward the electrode terminal 15 by the joint member 13 covering the notch portion 14*f*1 entirely or mostly, so that the joint portion 14*a* is not arranged at an appropriate position.

2. Second Embodiment

A semiconductor device according to a second embodiment will be described. The semiconductor device 1 according to the second embodiment differs from that of the first embodiment in terms of shape of the notch portion 14*f*. The following will omit a description of a configuration similar to that of the first embodiment and will mainly provide a description of a configuration different from that of the first embodiment.

2.1 Configuration of Gate Terminal

A configuration of the gate terminal 14 will be described in detail with reference to FIG. 8 and FIG. 9. The following will mainly provide a description of configurations of the joint portion 14*a* and the notch portion 14*f*.

Figure 8:
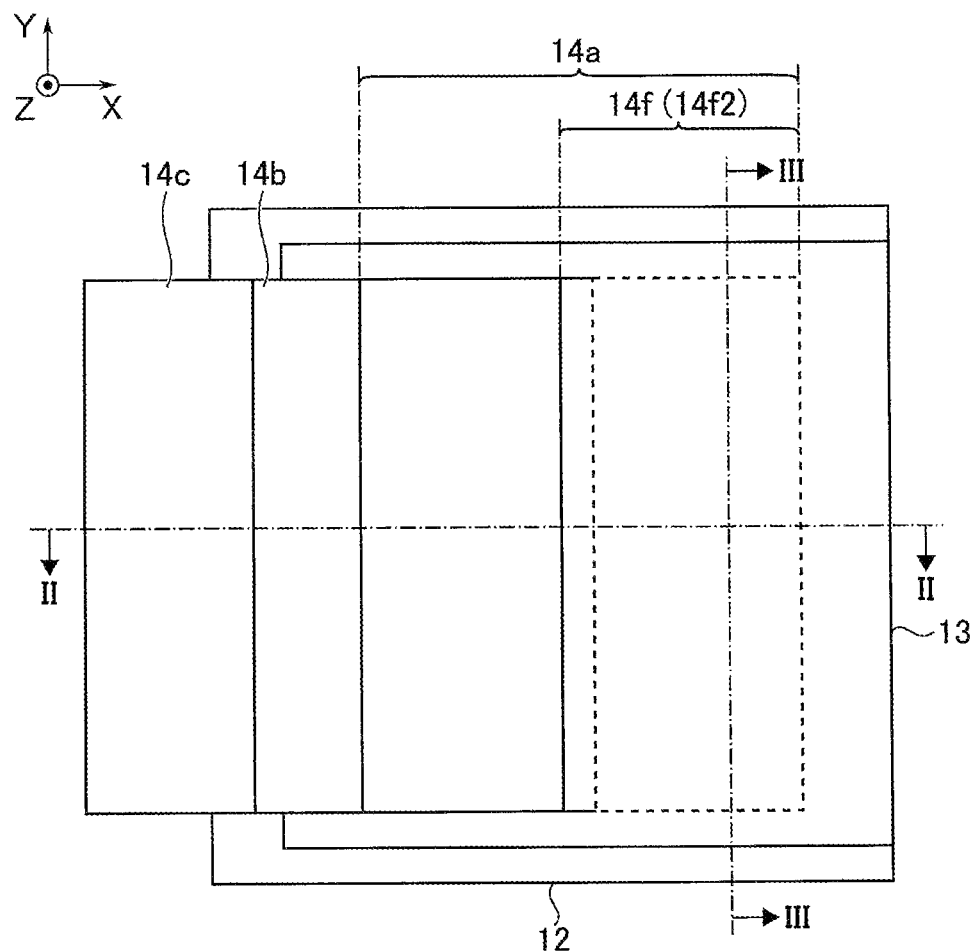
FIG. 8 is a plan view showing a configuration of part of a gate terminal included in a semiconductor device according to a second embodiment.

FIG. 8 is a plan view showing a configuration of part of the gate terminal 14 (the joint portion 14*a*, the bending portion 14*b*, and the bridge portion 14*c*).

As shown in FIG. 8, part of the notch portion 14*f* (hereinafter, also referred to as a "notch portion 14*f*2") is covered with the joint member 13. A portion surrounded by a broken line in FIG. 8 corresponds to the aforementioned part of the notch portion 14*f*2, which is covered with the joint member 13.

Figure 9:
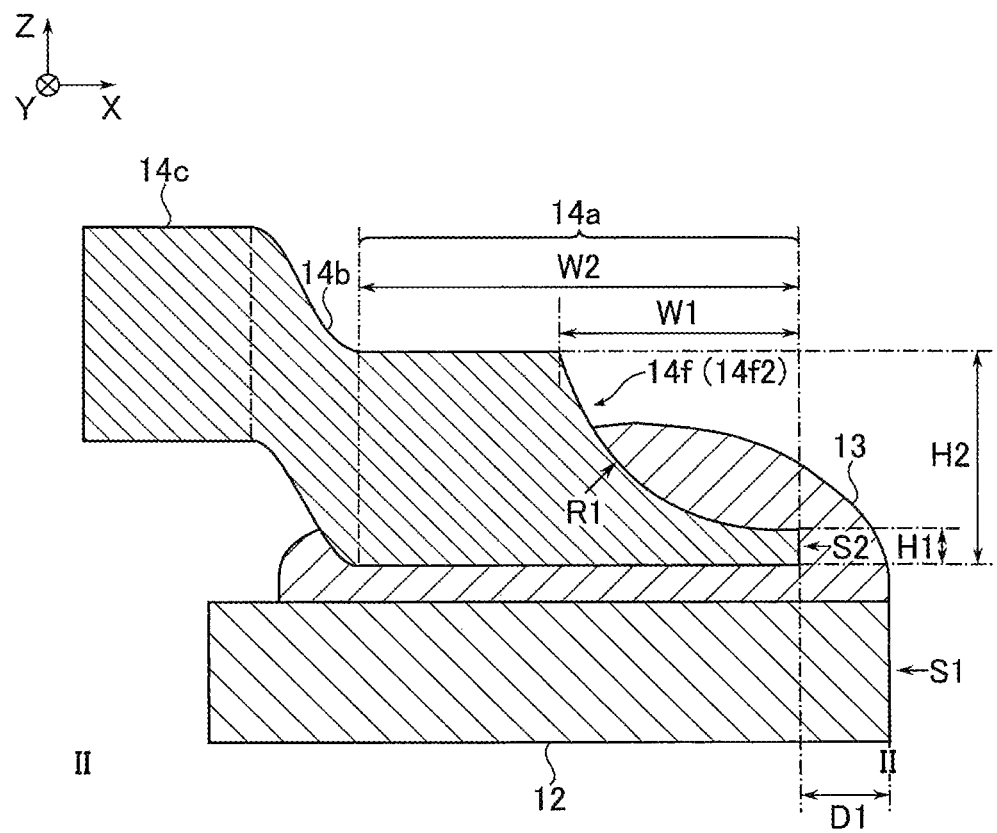
FIG. 9 is a cross-sectional view showing a cross-sectional structure of part of the gate terminal included in the semiconductor device according to the second embodiment.

FIG. 9 is a cross-sectional view showing a cross-sectional structure of part of the gate terminal 14 (a cross-sectional view taken along line II-II of FIG. 8).

As shown in FIG. 9, the notch portion 14*f*2 has a curved surface. More specifically, the notch portion 14*f*2 is formed into a circle shape with a radius R1. The circle shape is formed by, for example, anisotropic etching. The method of forming the circle shape is not limited to this. The radius R1 may be set to a given value. The radius R1 is determined by, for example, a chemical used for etching.

A height H1 of the surface S2 of the joint portion 14*a* (a height from the lower surface of the joint portion 14*a* to the lower end of the notch portion 14*f*2) is lower than a height H2 from the lower surface of the joint portion 14*a* to the remaining part of the upper surface of the joint portion 14*a* excluding the notch portion 14*f*2. In the X direction, a position of the surface S2 of the joint portion 14*a* reaches a position of the surface S1 of the gate electrode 12. In other words, the side surface S2 of the end portion in the X direction of the joint portion 14*a* is positioned between the side surface S1 of one of the two end portions in the X direction of the gate electrode 12 and the side surface of the other end portion thereof. In the X direction, the width W1 of the notch portion 14*f*2 is smaller than the width W2 of the joint portion 14*a*.

The joint member 13 is in contact with the gate electrode 12, the lower surface of the joint portion 14*a* facing the gate electrode 12, and at least part of the notch portion 14*f*2. The joint member 13 is in contact with the side surface S2 of the end portion in the X direction of the joint portion 14*a*. The joint member 13 is in contact with part of the lower surface of the bending portion 14*b*. In other words, the joint member 13 covers the surface S2 of the joint portion 14*a*, part of the notch Portion 14*f*2, and part of the lower surface of the bending portion 14*b*. That is, the notch portion 14*f*2 has a portion not covered with (not in contact with) the joint member 13.

The distance D1 in the X direction from the surface S1 of the gate electrode 12 to the surface S2 of the joint portion 14*a* may be set to a similar distance to, for example, that of the first embodiment.

The height H1 of the surface S2 of the joint portion 14*a* may be set to a similar height to, for example, that of the first embodiment.

The width W1 of the notch portion 14*f*2 may be set to a similar width to, for example, that of the first embodiment.

A cross-sectional view taken along line of FIG. 8 is similar to that of FIG. 5 according to the first embodiment.

As with the first embodiment, the present embodiment can enhance the strength of joint between the gate electrode 12 and the gate terminal 14. As with the first embodiment, this can prevent a situation in which the joint member 13 runs downward from one end of the gate electrode 12, thereby failing to cover the notch portion 14*f*2. Furthermore, as with the first embodiment, this can prevent a situation in which the joint portion 14a is pressed in the X direction toward the electrode terminal 15, so that the joint portion 14a is not arranged at an appropriate position. Accordingly, the yield of the semiconductor device can be improved.

3. Third Embodiment

A semiconductor device according to a third embodiment will be described. The semiconductor device 1 according to the third embodiment differs from that of the first embodiment in terms of shape of the notch portion 14f. The following will omit a description of a configuration similar to that of the first embodiment and will mainly provide a description of a configuration different from that of the first embodiment.

3.1 Configuration of Gate Terminal

The configuration of the gate terminal 14 will be described in detail with reference to FIG. 10 and FIG. 11. The following will mainly provide a description of configurations of the joint portion 14a and the notch portion 14f.

Figure 10:
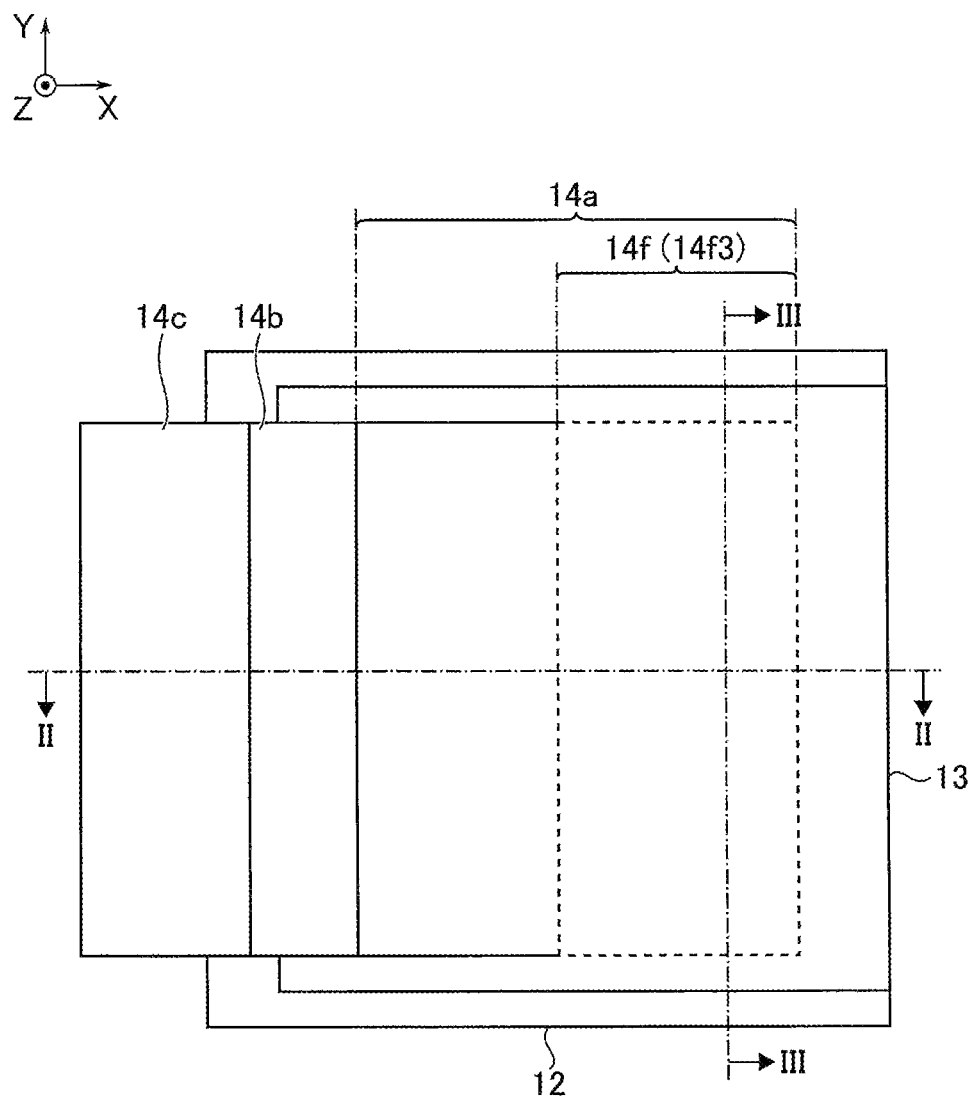
FIG. 10 is a plan view showing a configuration of part of a gate terminal included in a semiconductor device according to a third embodiment.

FIG. 10 is a plan view showing a configuration of part of the gate terminal 14 (the joint portion 14a, the bending portion 14b, and the bridge portion 14c).

As shown in FIG. 10, part of the notch portion 14f (hereinafter, also referred to as a "notch portion 14f3") is covered with the joint member 13. A portion surrounded by a broken line in FIG. 10 corresponds to the aforementioned part of the notch portion 14f3, which is covered with the joint member 13.

Figure 11:
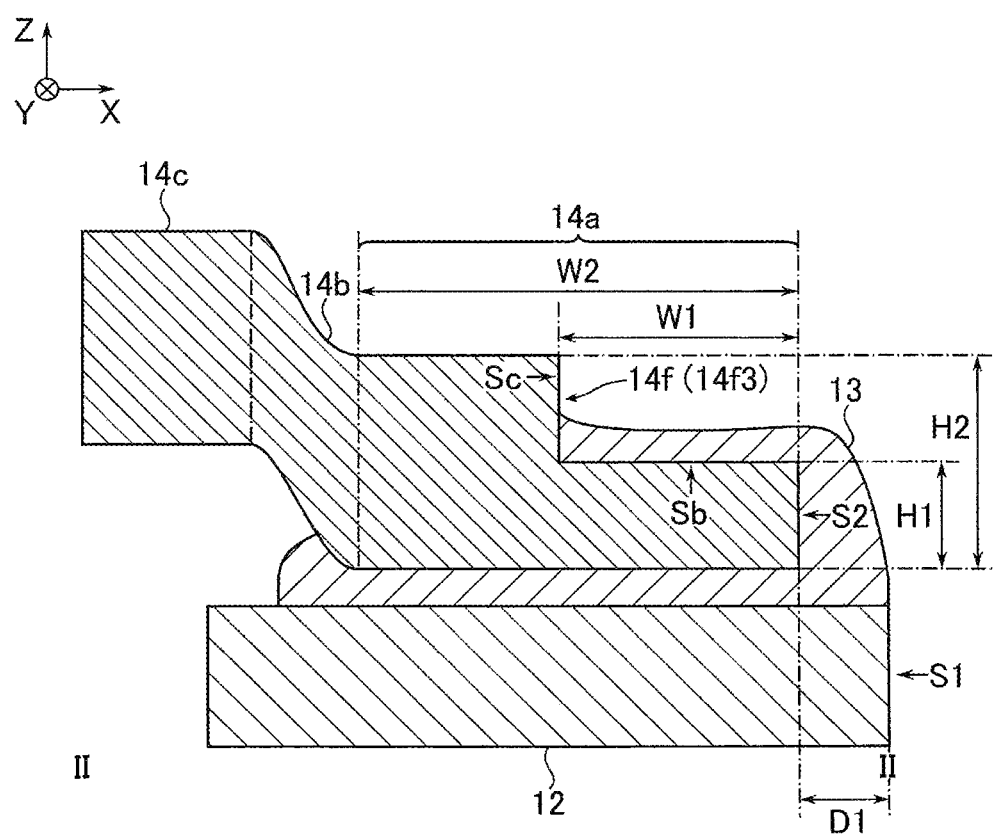
FIG. 11 is a cross-sectional view showing a cross-sectional structure of part of the gate terminal included in the semiconductor device according to the third embodiment.

FIG. 11 is a cross-sectional view showing a cross-sectional structure of part of the gate terminal 14 (a cross-sectional view taken along line II-II of FIG. 10).

As shown in FIG. 11, the notch portion 14f3 has a surface Sb positioned below the remaining part of the upper surface of the joint portion 14a excluding the notch portion 14f3. In other words, the upper surface of the joint portion 14a has a step in the X direction. The surface Sb is formed by, for example, anisotropic etching. The method of forming the surface Sb is not limited to this.

The height H1 of the surface S2 of the joint portion 14a (a height from the lower surface of the joint portion 14a to the lower end (surface Sb) of the notch portion 14f3) is lower than the height H2 from the lower surface of the joint portion 14a to the remaining part of the upper surface of the joint portion 14a excluding the notch portion 14f3. In the X direction, a position of the surface S2 of the joint portion 14a reaches a position of the surface S1 of the gate electrode 12. In other words, the side surface S2 of the end portion in the X direction of the joint portion 14a is positioned between the side surface S1 of one of the two end portions in the X direction of the gate electrode 12 and the side surface of the other end portion thereof. In the X direction, the width W1 of the notch portion 14f3 is smaller than the width W2 of the joint portion 14a.

The joint member 13 is in contact with the gate electrode 12, the lower surface of the joint portion 14a facing the gate electrode 12, and at least part of the notch portion 14f3. The joint member 13 is in contact with the side surface S2 of the end portion in the X direction of the joint portion 14a. The joint member 13 is in contact with part of the lower surface of the bending portion 14b. In other words, the joint member 13 covers the surface S2 of the joint portion 14a, part of the notch portion 14f3, and part of the lower surface of the bending portion 14b. That is, the notch portion 14f3 has a portion not covered with (not in contact with) the joint member 13.

The distance D1 in the X direction from the surface S1 of the gate electrode 12 to the surface S2 of the joint portion 14a may be set to a similar distance to, for example, that of the first embodiment.

The height H1 of the surface S2 of the joint portion 14a may be set to a similar height to, for example, that of the first embodiment.

The width W1 of the notch portion 14f3 may be set to a similar width to, for example, that of the first embodiment.

FIG. 11 shows the example in which the joint member 13 is in contact with a surface excluding the surface Sb of the notch portion 14f3 (corresponding to the surface substantially perpendicular to the remaining part of the upper surface of the joint portion 14a excluding the notch portion 14f3 and the surface Sb of the notch portion 14f3, and hereinafter, referred to as a "surface Sc"). However, the joint member 13 may not be in contact with the surface Sc of the notch portion 14f3.

A cross-sectional view taken along line of FIG. 10 is similar to that of FIG. 5 according to the first embodiment.

As with the first embodiment, the present embodiment can enhance the strength of joint between the gate electrode 12 and the gate terminal 14. As with the first embodiment, this can prevent a situation in which the joint member 13 runs downward from one end of the gate electrode 12, thereby failing to cover the notch portion 14f3. Furthermore, as with the first embodiment, this can prevent a situation in which the joint portion 14a is pressed in the X direction toward the electrode terminal 15, so that the joint portion 14a is not arranged at an appropriate position. Accordingly, the yield of the semiconductor device can be improved.

3.2 Modification

A semiconductor device according to a modification of the third embodiment will be described. The semiconductor device 1 according to the modification of the third embodiment differs from that of the third embodiment in that the surface Sb of the notch portion 14f3 is provided with a groove. The following will omit a description of a configuration similar to that of the third embodiment and will mainly provide a description of a configuration different from that of the third embodiment.

3.2.1 Configuration of Gate Terminal

The configuration of the gate terminal 14 will be described in detail with reference to FIG. 12 and FIG. 13. The following will mainly provide a description of configurations of the joint portion 14a and the notch portion 14f.

Figure 12:
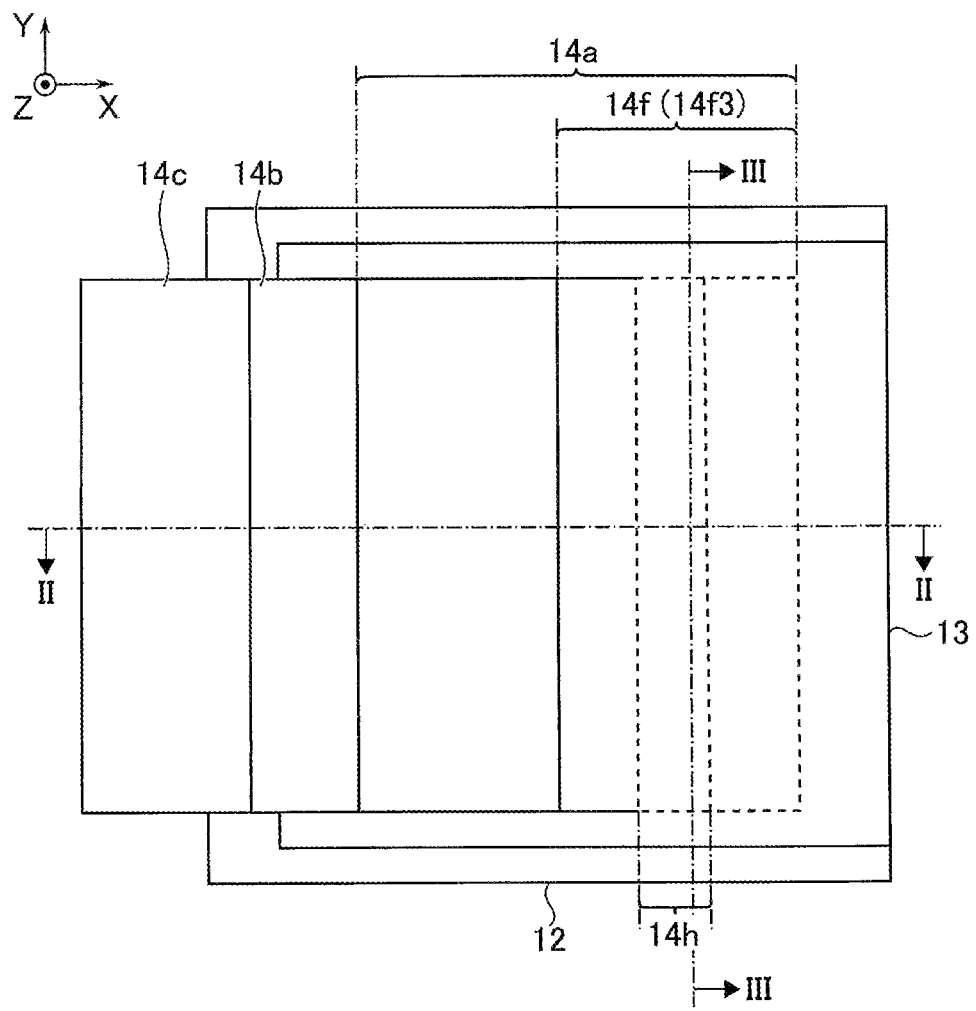
FIG. 12 is a plan view showing a configuration of part of a gate terminal included in a semiconductor device according to a modification of the third embodiment.

FIG. 12 is a plan view showing a configuration of part of the gate terminal 14 (the joint portion 14a, the bending portion 14b, and the bridge portion 14c).

As shown in FIG. 12, the notch portion 14f3 has a groove 14h. Part of the notch portion 14f3 (including the groove 14h) is covered with the joint member 13. A portion surrounded by a broken line in FIG. 12 corresponds to the aforementioned part of the notch portion 14f3, which is covered with the joint member 13.

Figure 13:
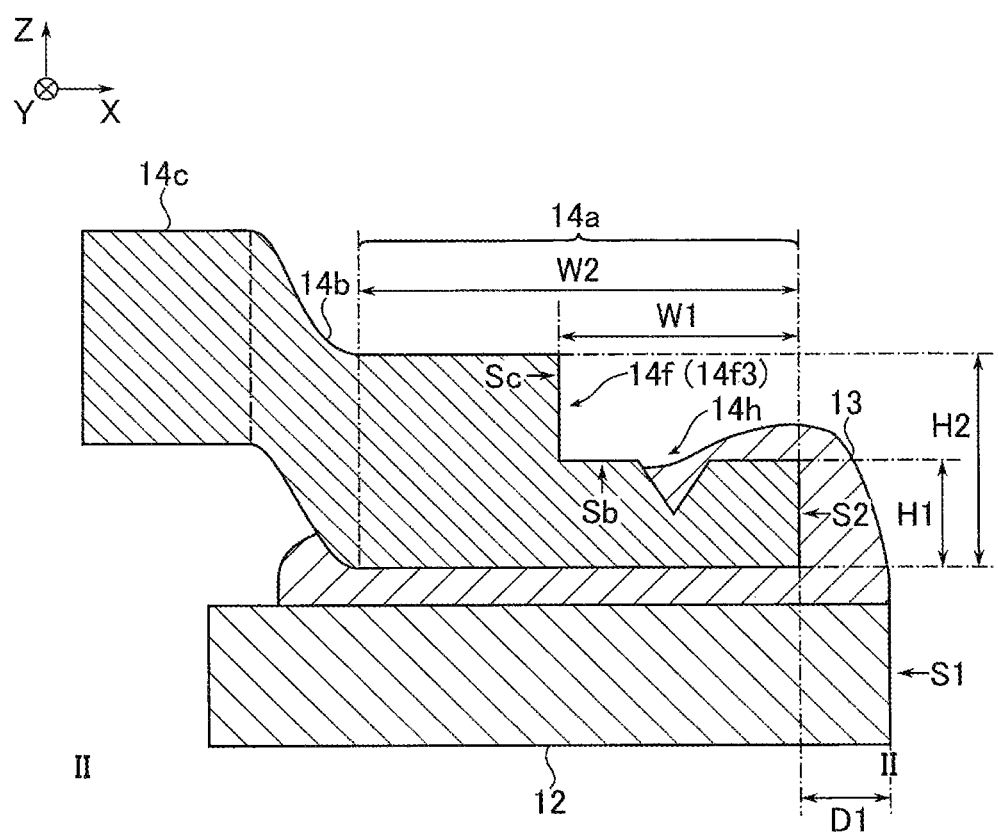
FIG. 13 is a cross-sectional view showing a cross-sectional structure of part of the gate terminal included in the semiconductor device according to the modification of the third embodiment.

FIG. 13 is a cross-sectional view showing a cross-sectional structure of part of the gate terminal 14 (a cross-sectional view taken along line II-II of FIG. 12).

As shown in FIG. 13, the notch portion 14f3 has the groove 14h. The groove 14h is provided on the surface Sb of the notch portion 14f3. The groove 14h is formed by, for example, anisotropic etching. The method of forming the groove 14h is not limited to this.

A position, of the lower end of the groove 14h does not reach a position of the lower surface of the joint portion 14a. A position of one end in the X direction of the groove 14h (one end closer to the surface S2 of the joint portion 14a)

does not reach a position of the surface S2 of the joint portion 14a. In the X direction, a width of the groove 14h is smaller than the width W1 of the notch portion 14f3.

The joint member 13 is in contact with the gate electrode 12, the lower surface of the joint portion 14a facing the gate electrode 12, and at least part of the notch portion 14f3. The joint member 13 is in contact with the side surface S2 of the end portion in the X direction of the joint portion 14a. The joint member 13 is in contact with at least part of the groove 14h. The joint member 13 is in contact with part of the lower surface of the bending portion 14b. In other words, the joint member 13 covers the surface S2 of the joint portion 14a, part of the notch portion 14f3, part of the groove 14h, and part of the lower surface of the bending portion 14b. That is, the notch portion 14f3 has a portion not covered with (not in contact with) the joint member 13.

A cross-sectional view taken along line III-III of FIG. 12 is similar to that of FIG. 5 according to the first embodiment.

As with the first embodiment, the present modification can improve the yield of the semiconductor device.

Furthermore, as with the modification of the first embodiment, the present modification can prevent a situation in which the joint portion 14a is pressed in the X direction toward the electrode terminal 15, so that the joint portion 14a is not arranged at an appropriate position.

4. Fourth Embodiment

A semiconductor device according to a fourth embodiment will be described. The semiconductor device 1 according to the fourth embodiment differs from that of the first embodiment, in that the joint portion 18a of the source terminal 18 has a notch portion 18f. The following will omit a description of a configuration similar to that of the first embodiment and will mainly provide a description of a configuration different from that of the first embodiment.

4.1 Configuration of Semiconductor Device

A configuration of the semiconductor device 1 will be described with reference to FIG. 14. FIG. 14 is a plan view showing an example of the configuration of the semiconductor device 1.

As shown in FIG. 14, the upper surface of the joint portion 18a is provided with the notch portion 18f. That is, the notch portion 18f corresponds to part of the upper surface of the joint portion 18a. The notch portion 18f is provided on at least one of the two end portions in the X direction of the upper surface of the joint portion 18a (the end portion far from the bending portion 18b). In other words, the joint portion 18a is provided with the notch portion 18f on at least one of the two end portions in the X direction of the upper surface of the joint portion 18a. Configurations of the joint portion 18a and the notch portion 18f will be described later in detail.

The rest of the configuration of the semiconductor device 1 is similar to the configuration shown in FIG. 1 described in the first embodiment.

Figure 15:
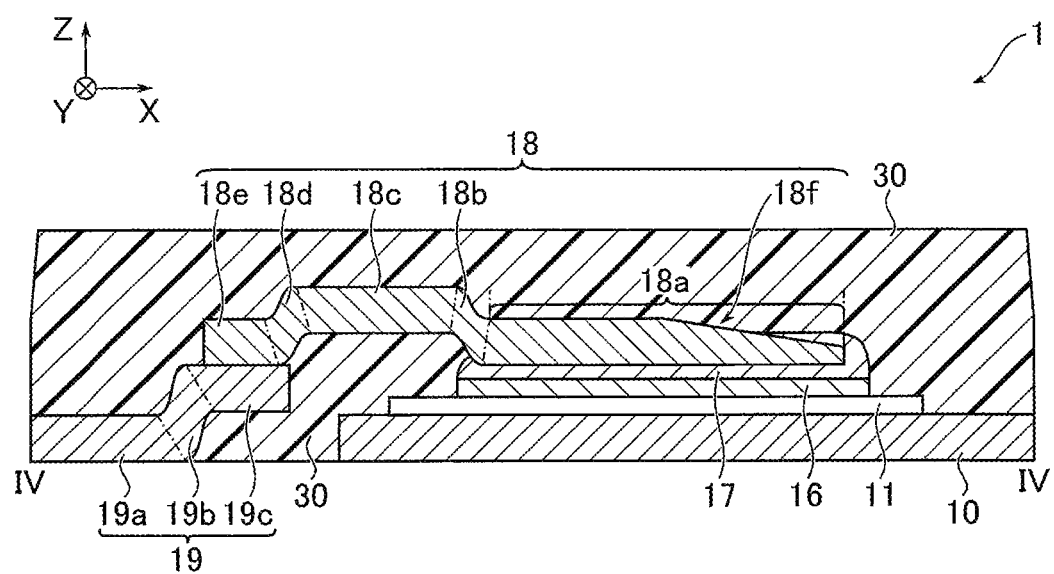
FIG. 15 is a cross-sectional view showing an example of a cross-sectional structure of the semiconductor device according to the fourth embodiment.

FIG. 15 is a cross-sectional view showing an example of a cross-sectional structure of the semiconductor device 1 (a cross-sectional view taken along line IV-IV of FIG. 14).

As shown in FIG. 15, the electrode terminal 19 is bent at the bending portion 19b in such a manner that the upper surface of the joint portion 19c is positioned above the upper surface of the base portion 19a.

The source electrode 16 is provided on the chip 11. The joint member 17 is provided on the source electrode 16. The joint portion 18a of the source terminal 18 is provided on the joint member 17. The lower surface of the joint portion 18a, the side surface of the end portion in the X direction of the joint portion 18a, and part of the notch portion 18f are in contact with the joint member 17. The source terminal 18 is bent at the bending portions 18b and 18d in such a manner that the upper surface of the bridge portion 18c is positioned above the upper surface of the joint portion 18a and the upper surface of the joint portion 18e. The notch portion 18f extends in the X direction downward from the remaining part of the upper surface of the joint portion 18a excluding the notch portion 18f.

The joint portion 18e of the source terminal 18 is provided on the joint portion 19c of the electrode terminal 19. The joint portion 18e is joined to the joint portion 19c by means of a joint member (not shown).

The lead frame 10, the chip 11, the source electrode 16, the joint member 17, the source terminal 18, and the electrode terminal 19 are covered with the resin 30. A space surrounded by the lead frame 10, the chip 11, the source electrode 16, the joint member 17, the source terminal 18, and the electrode terminal 19 is filled with the resin 30.

4.2 Configuration of Source Terminal

A configuration of the source terminal 18 will be described in detail with reference to FIG. 16 to FIG. 18. The following will mainly provide a description of configurations of the joint portion 18a and the notch portion 18f.

FIG. 16 is a plan view showing a configuration of part of the source terminal 18 (the joint portion 18a, the bending portion 18b, and the bridge portion 18c). As shown in FIG. 16, the joint portion 18a is provided on the joint member 17. Part of the notch portion 18f is covered with the joint member 17. A portion surrounded by a broken line in FIG. 16 corresponds to the aforementioned part of the notch portion 18f, which is covered with the joint member 17.

FIG. 16 shows the example in which the one of the two ends in the X direction of the joint member 17 which is closer to the notch portion 18f reaches one end in the X direction of the source electrode 16; however, the aforementioned one end of the joint member 17 may not reach the aforementioned one end in the X direction of the source electrode 16.

Figure 17:
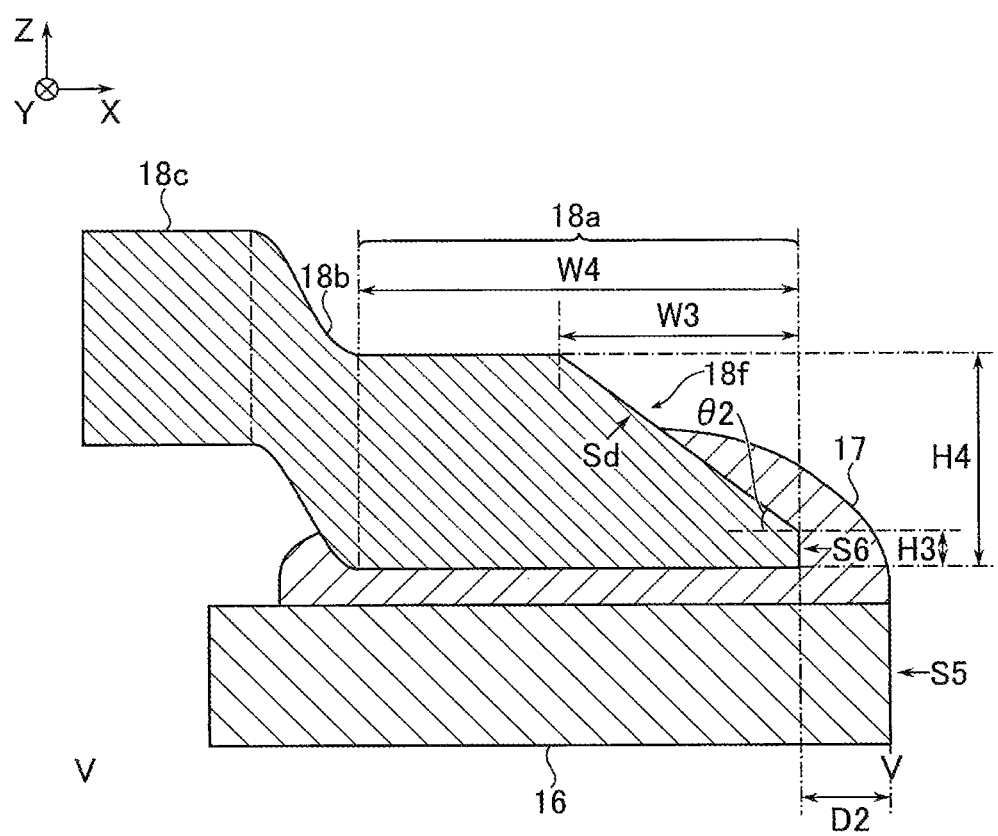
FIG. 17 is a cross-sectional view showing a cross-sectional structure of part of the source terminal included in the semiconductor device according to the fourth embodiment.

FIG. 17 is a cross-sectional view showing a cross-sectional structure of part of the source terminal 18 (a cross-sectional view taken along line V-V of FIG. 16). In the following description, the side surface of the end portion in the X direction of the source electrode 16 (the side surface (the end surface) of the end portion far from the bending portion 18b) will be referred to as "surface S5", and the side surface (the end surface) of the end portion in the X direction of the joint portion 18a will be referred to as a "surface S6".

As shown in FIG. 17, the notch portion 18f has an inclined surface Sd with respect to the remaining part of the upper surface of the joint portion 18a excluding the notch portion 18f. The inclined surface Sd is formed by, for example, a similar method to the method of forming the inclined surface Sa of the notch portion 14f1 described in the first embodiment. An angle θ2 of the inclined surface Sd with respect to a surface in parallel to the remaining part of the upper surface of the joint portion 18a excluding the notch, portion 18f may be set to a given value.

A height H3 of the surface S6 of the joint portion 18a (a height from the lower surface of the joint portion 18a to the lower end of the notch portion 18f) is lower than a height H4 from the lower surface of the joint portion 18a to the remaining part of the upper surface of the joint portion 18a excluding the notch portion 18f. In the X direction, a position of the surface S6 of the joint portion 18a does not reach a position of the surface S5 of the source electrode 16.

In other words, the side surface S6 of the end portion in the X direction of the joint portion 18a is positioned between the side surface S5 of one of the two end portions in the X direction of the source electrode 16 and the side surface of the other end portion thereof. In the X direction, the width W3 of the notch portion 18f is smaller than a width W4 of the joint portion 18a.

The joint member 17 is in contact with the source electrode 16, the lower surface of the joint portion 18a facing the source electrode 16, and at least part of the notch portion 18f. The joint member 17 is in contact with the side surface S6 of the end portion in the X direction of the joint portion 18a. The joint member 17 is in contact with part of the lower surface of the bending portion 18b. In other words, the joint member 17 covers the surface S6 of the joint portion 18a, part of the notch portion 18f, and part of the lower surface of the bending portion 18b. That is, the notch portion 18f has a portion not covered with (not in contact with) the joint member 17.

When the molten joint member 17 is provided on the source electrode 16 and the joint portion 18a of the source terminal 18 is provided on the joint member 17, the joint portion 18a is self-aligned by surface tension of the joint member 17, thereby being arranged at an appropriate position. Furthermore, at this time, the joint member 17 flows from the interval between the source electrode 16 and the joint portion 18a, expands therefrom in all of the directions, and then reaches the side surface of the joint portion 18a, the notch portion 18f, and the lower surface of the bending portion 18b. In this manner, the surface S6 of the joint portion 18a, part of the notch portion 18f, and part of the lower surface of the bending portion 18b are covered with the joint member 17 by surface tension of the joint member 17.

The distance D2 in the X direction from the surface S5 of the source electrode 16 to the surface S6 of the joint portion 18a may be set, for example, in a similar manner to that of the distance D1 described in the first embodiment.

The height H3 of the surface S6 of the joint portion 18a may be set, for example, in a similar manner to that of the height H1 described in the first embodiment.

The width W3 of the notch portion 18f may be set, for example, in a similar manner to the width W1 described in the first embodiment.

FIG. 18 is a cross-sectional view showing a cross-sectional structure of part of the source terminal 18 (a cross-sectional view taken along line VI-VI of FIG. 16). The example shown in FIG. 18 omits the joint member 17 in contact with the upper surface of the notch portion 18f. In the following description, the side surfaces (the end surfaces) of the two end portions in the Y direction of the joint portion 18a will be referred to as a "surface S7" and a "surface S8", respectively.

As shown in FIG. 18, the lower surface of the joint portion 18a is in contact with the joint member 17. Part of the surface S7 of the joint portion 18a and part of the surface S8 of the joint portion 18a are in contact with the joint member 17. In other words, the joint member 17 covers part of the surface S7 of the joint portion 18a and part of the surface S8 of the joint portion 18a.

In the present embodiment, the source terminal 18 has a similar configuration to that of the gate terminal 14. This can enhance the strength of a joint between the source electrode 16 and the source terminal 18 as compared with the case in which only the lower surface of the joint portion 18a and part of the side surface of the joint portion 18a are covered with the joint member 17. As with the first embodiment, this can prevent a situation in which the joint member 17 runs downward from one end of the source electrode 16, thereby failing to cover the notch portion 18f. Furthermore, as with the first embodiment, this can prevent a situation in which the joint portion 18a is pressed in the X direction toward the electrode terminal 19 by the joint member 17 covering the notch portion 18f entirely or mostly, so that the joint portion 18a is not arranged at an appropriate position.

Accordingly, as with the first embodiment, the configuration according to the present embodiment can improve the yield of the semiconductor device.

The configuration of the gate terminal 14 (the configuration of the notch portion 14f of the joint portion 14a) according to each of the modification of the first embodiment, the second embodiment, the third embodiment, and the modification of the third embodiment may be applied to the source terminal 18 according to the present embodiment.

5. Modifications, Etc.

As described above, a semiconductor device (1) according to an embodiment includes: a chip (11); a first electrode (12/16) provided on the chip; a first connector (14/18) provided above the first electrode, extending in a first direction (X), and provided with a joint portion (14a/18a) to be joined to the first electrode, on an end portion in the first direction of the first connector (14/18); and a joint member (13/17) for use in joint between the first electrode and the joint portion. The joint portion (14a/18a) is provided with a notch portion (14f/18f) on at least one end portion in the first direction (X) of an upper surface of the joint portion. The joint member (13/17) is in contact with the first electrode (12/16), a lower surface of the joint portion (14a/18a) facing the first electrode, and at least part of the notch portion (14f/18f).

The embodiments are not limited to those described in the above, and various modifications can be made.

The embodiments in, the above describe the case in which the notch portion has an inclined surface, a curved surface, or a surface positioned below the remaining part of the upper surface of the joint portion excluding the notch portion. However, the notch portion may be formed into a shape other than these.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a chip;
   a first electrode provided on the chip;
   a first connector provided above the first electrode, extending in a first direction, and provided with a joint portion to be joined to the first electrode, on an end portion in the first direction of the first connector; and
   a joint member between and joining the first electrode and the joint portion,
   wherein the joint portion is provided with a notch portion on at least one end portion in the first direction of an upper surface of the joint portion, and the joint member is in contact with the first electrode, a lower surface of the joint portion facing the first electrode, and at least part of the notch portion.

2. The device according to claim 1, wherein the joint member is in contact with a side surface of an end portion in the first direction of the joint portion.

3. The device according to claim 1, wherein a height from the lower surface of the joint portion to a lower end of the notch portion is lower than a height from the lower surface of the joint portion to a remaining part of the upper surface of the joint portion excluding the notch portion.

4. The device according to claim 1, wherein a side surface of an end portion in the first direction of the joint portion is positioned between a side surface of one end portion in the first direction of the first electrode and a side surface of the other end portion in the first direction of the first electrode.

5. The device according to claim 1, wherein a width of the notch portion is smaller in the first direction than a width of the joint portion.

6. The device according to claim 1, wherein the notch portion includes a portion not in contact with the joint member.

7. The device according to claim 1, wherein the notch portion includes an inclined surface with respect to a remaining part of the upper surface of the joint portion excluding the notch portion.

8. The device according to claim 1, wherein the notch portion extends in the first direction downward from a remaining part of the upper surface of the joint portion excluding the notch portion.

9. The device according to claim 1, wherein the notch portion includes a curved surface.

10. The device according to claim 9, wherein the notch portion is formed into a circle shape.

11. The device according to claim 1, wherein the notch portion includes a surface positioned below a remaining part of the upper surface of the joint portion excluding the notch portion.

12. The device according to claim 1, wherein the notch portion is provided with a groove.

13. The device according to claim 12, wherein a position of a lower end of the groove does not reach a position of the lower surface of the joint portion.

14. The device according to claim 12, wherein a position of one end in the first direction of the groove does not reach a position of a side surface of an end portion in the first direction of the joint portion.

15. The device according to claim 12, wherein a width of the groove is smaller in the first direction than a width of the notch portion.

16. The device according to claim 12, wherein the joint member is in contact with at least part of the groove.

17. The device according to claim 1, wherein the first electrode is a gate electrode.

18. The device according to claim 1, wherein the first electrode is a source electrode.

19. The device according to claim 1, wherein the joint member is solder.

20. The device according to claim 1, further comprising a frame, wherein the chip is provided on the frame.

* * * * *